United States Patent
Hsieh et al.

(10) Patent No.: US 11,503,698 B1
(45) Date of Patent: Nov. 15, 2022

(54) FLEXIBLE CIRCUIT BOARD AND HEAT SPREADER THEREOF

(71) Applicant: CHIPBOND TECHNOLOGY CORPORATION, Hsinchu (TW)

(72) Inventors: Yi-Ling Hsieh, Kaohsiung (TW); Pei-Ying Lee, Kaohsiung (TW); Dong-Sheng Li, Kaohsiung (TW)

(73) Assignee: Chipbond Technology Corporation, Hsinchu (TW)

( * ) Notice: Subject to any disclaimer, the term of this patent is extended or adjusted under 35 U.S.C. 154(b) by 0 days.

(21) Appl. No.: 17/494,002

(22) Filed: Oct. 5, 2021

(30) Foreign Application Priority Data

Aug. 9, 2021 (TW) .................................. 110133110

(51) Int. Cl.
  *H05K 1/02* (2006.01)
  *F28F 21/08* (2006.01)
  *H05K 7/20* (2006.01)

(52) U.S. Cl.
  CPC .......... *H05K 1/0203* (2013.01); *F28F 21/085* (2013.01); *H05K 1/028* (2013.01);
  (Continued)

(58) Field of Classification Search
  CPC ..... H05K 1/0201; H05K 1/0203–0204; H05K 1/0271; H05K 1/028; H05K 1/118; H05K 1/147; H05K 1/189; H05K 7/20; H05K 7/2039; H05K 7/20454; H05K 7/2089; H05K 2201/051; H05K 2201/066; H05K 2201/10166; H05K 2201/10674; H01L 23/12; H01L 23/16; H01L 23/3121; H01L 23/34–3731; H01L 24/32; H01L 2224/32225; H01L 2224/291; H01L 24/07; H01L 24/18; H01L 29/00; H01H 9/52; F28F 3/00; F28F 3/06; F28F 7/00; F28F 21/085; H01M 4/66
  See application file for complete search history.

(56) References Cited

U.S. PATENT DOCUMENTS 10,299,374 B2 * 5/2019 Shashkov ............... C25D 11/02
2012/0181067 A1 * 7/2012 Wen ...................... H05K 1/0206
174/252

(Continued)

FOREIGN PATENT DOCUMENTS

CN 106163227 A 11/2016
TW 200816422 A 4/2008

(Continued)

OTHER PUBLICATIONS

Taiwanese Office Action dated Jun. 6, 2022 for Taiwanese Patent Application No. 110133110, 3 pages.

*Primary Examiner* — Zachary Pape
*Assistant Examiner* — Amir A Jalali
(74) *Attorney, Agent, or Firm* — Demian K. Jackson; Jackson IPG PLLC

(57) ABSTRACT

A flexible circuit board includes a flexible substrate, an electronic component and a heat spreader. The electronic component and the heat spreader are disposed on a top surface and a bottom surface of the flexible substrate, respectively. The heat spreader includes a copper layer which contains more than or equal to 50% copper grains by volume with (1,0,0) crystallographic orientation.

10 Claims, 1 Drawing Sheet

(52) U.S. Cl.
CPC ......... *H05K 7/205* (2013.01); *H05K 7/20509* (2013.01); *H05K 2201/066* (2013.01); *H05K 2201/10674* (2013.01)

(56) References Cited

U.S. PATENT DOCUMENTS

| | | | |
|---|---|---|---|
| 2013/0320390 A1* | 12/2013 | Palaniswamy | H01L 23/498 174/266 |
| 2014/0268780 A1* | 9/2014 | Wang | H05K 1/028 362/249.06 |
| 2019/0292671 A1* | 9/2019 | Zhamu | C22C 32/0084 |

FOREIGN PATENT DOCUMENTS

| | | |
|---|---|---|
| TW | 201918590 A | 5/2019 |
| TW | 202120748 A | 6/2021 |

\* cited by examiner

FLEXIBLE CIRCUIT BOARD AND HEAT SPREADER THEREOF

FIELD OF THE INVENTION

This invention relates to a flexible circuit board, and more particularly to a flexible circuit board having a heat spreader.

BACKGROUND OF THE INVENTION

Small, thin and flexible circuit boards are widely used in thin mobile devices, e.g. smartphone, laptop and smart watch, but heat dissipation of the flexible circuit board is difficult owing to its small size. For this reason, a heat spreader is usually attached onto the bottom surface of the flexible circuit board for heat dissipation. With reference to FIG. 1, a conventional flexible circuit board 400 is connected to a panel 200 and a control circuit board 300, in practice, both ends of the flexible circuit board 400 are electrically connected to the panel 200 and the control circuit board 300 respectively such that signals from the control circuit board 300 are processed and delivered to control the panel 200. Moreover, the flexible circuit board 400 and a heat spreader 410 attached on the bottom surface of the flexible circuit board 400 are bent together in order to match the installation requirement. As the mobile device is getting thinner and thinner, the flexible circuit board 400 has to be bent with more radius of curvature, that may cause delamination of the heat spreader 410 having a lower bending strength away from the flexible circuit board 400 and cause overheat damages to the flexible circuit board 400.

SUMMARY

One object of the present invention is to provide a heat spreader containing more than or equal to 50% copper grains by volume with (1,0,0) crystallographic orientation such that the bending strength of the heat spreader is improved significantly to prevent the delamination of the heat spreader from a flexible circuit board.

A flexible circuit board of the present invention includes a flexible substrate, an electronic component and a heat spreader. The electronic component is mounted on a top surface of the flexible substrate. The heat spreader is disposed on a bottom surface of the flexible substrate and includes a copper layer containing more than or equal to 50% copper grains by volume with (1,0,0) crystallographic orientation.

A heat spreader of the present invention is configured for dissipating heat from a flexible circuit board and includes a copper layer containing more than or equal to 50% copper grains by volume with (1,0,0) crystallographic orientation.

The heat spreader exhibits excellent bending strength because of the copper layer containing more than or equal to 50% copper grains by volume with (1,0,0) crystallographic orientation. Consequently, delamination of the bent heat spreader from the flexible circuit board is preventable.

DETAILED DESCRIPTION OF THE INVENTION

Figure 1:
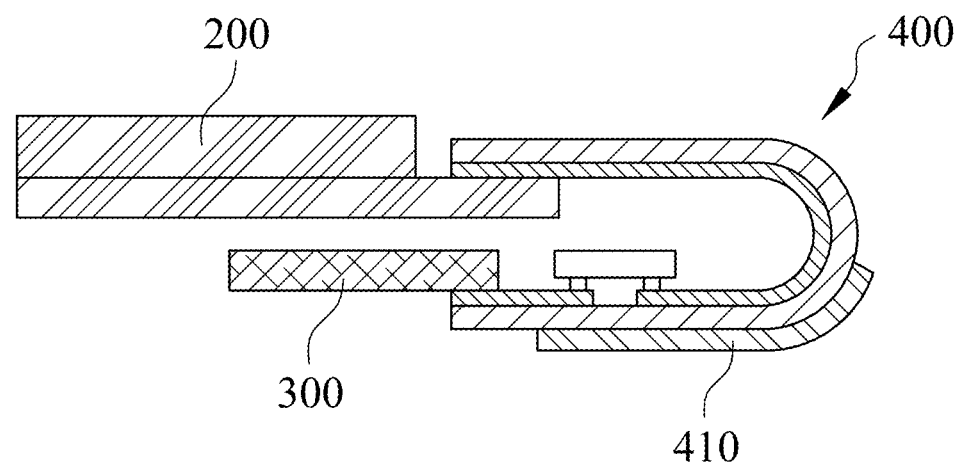
FIG. 1 is a cross-section view diagram illustrating a conventional flexible circuit board connected with a panel and a control circuit board.
Figure 2:
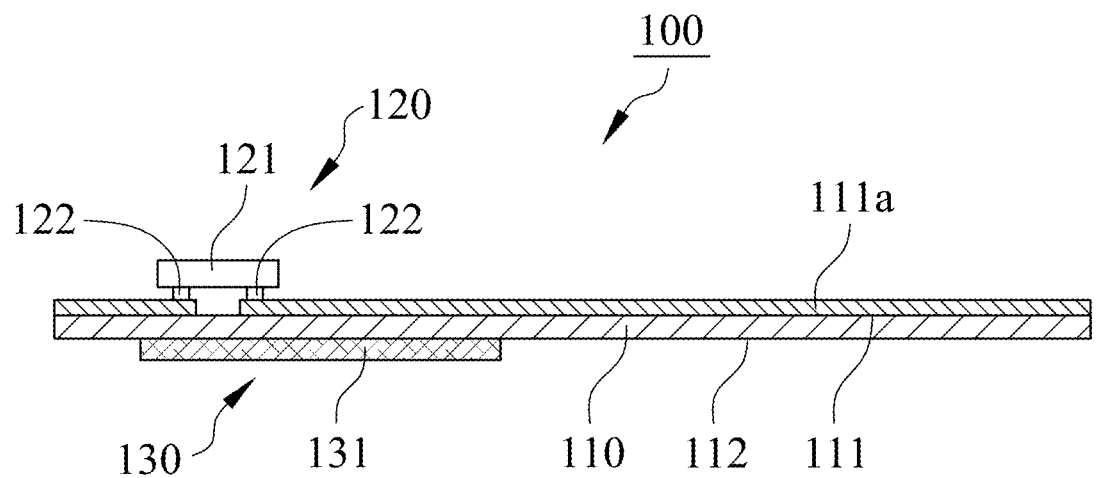
FIG. 2 is a cross-section view diagram illustrating a flexible circuit board in accordance with one embodiment of the present invention.

FIG. 2 is a cross-section view diagram illustrating a flexible circuit board 100 of one embodiment of the present invention. The flexible circuit board 100 includes a flexible substrate 110, an electronic component 120 and a heat spreader 130, and further includes solder resist and chip underfill which are not shown in diagram owing to they are irrelevant to technical features of the present invention.

With reference to FIG. 2, the flexible substrate 110 is made of polyimide or other polymers having excellent electric insulativity, stability and chemical resistance. A patterned circuit layer 111a on a top surface 111 of the flexible substrate 110 includes fine circuit traces which are formed by etching a copper layer plated on the top surface 111. The electronic component 120 is mounted on the top surface 111 of the flexible substrate 110 and electrically connected to the patterned circuit layer 111a. In this embodiment, the electronic component 120 is a flip-chip element including a chip 121 and a plurality of bumps 122, both ends of each of bumps 122 are electrically connected to the chip 121 and the patterned circuit layer 111a respectively for signal transmission between the chip 121 and the patterned circuit layer 111a.

The heat spreader 130 is disposed on a bottom surface 112 of the flexible substrate 110. In this embodiment, the heat spreader 130 includes a copper layer 131 and an adhesive (not shown), the adhesive is located between the copper layer 131 and the flexible substrate 110 and provided to adhere the copper layer 131 on the bottom surface 112 of the flexible substrate 110. Preferably, the heat spreader 130 is located under the electronic component 120 and provided for dissipating heat from the electronic component 120.

In this embodiment, the copper layer 131 contains more than or equal to 50% copper grains by volume with (1,0,0) crystallographic orientation. Film or laminate containing copper grains with (1,0,0) crystallographic orientation exhibits a good bending strength, for this reason, the copper layer 131 of the heat spreader 130 of this embodiment has a good bending strength to prevent delamination from the flexible circuit board 100. The electrical conductivity of the heat spreader 130 is not to be concerned owing to the heat spreader 130 is not electrically connected to the electronic component 120 and there is no current passing through the heat spreader 130 so the copper layer 131 of the heat spreader 130 can contain more than or equal to 50% copper grains by volume with (1,0,0) crystallographic orientation.

Preferably, in light of heat-dissipation efficiency of the heat spreader 130, the copper grains with (1,0,0) crystallographic orientation in the copper layer 131 of the heat spreader 130 have a grain size greater than 5 μm and the copper layer 131 of the heat spreader 130 has a thickness between 5 μm and 50 μm such that the heat spreader 130 has both good bending strength and good heat-dissipation performance.

The heat spreader 130 exhibits good bending strength because of the copper layer 131 containing more than or equal to 50% copper grains by volume with (1,0,0) crystallographic orientation. Consequently, it is possible to prevent the heat spreader 130 from peeling from the flexible circuit board 100.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A flexible circuit board comprising:
a flexible substrate;
an electronic component disposed on a top surface of the flexible substrate; and
a heat spreader disposed on a bottom surface of the flexible substrate and including a copper layer, wherein the copper layer contains more than or equal to 50% copper grains by volume with (1,0,0) crystallographic orientation.

2. The flexible circuit board in accordance with claim 1, wherein the copper grains with the (1,0,0) crystallographic orientation in the copper layer has a grain size more than 5 µm.

3. The flexible circuit board in accordance with claim 1, wherein the electronic component is a flip-chip element.

4. The flexible circuit board in accordance with claim 3, wherein the heat spreader is located under the electronic component and not electrically connected to the electronic component.

5. The flexible circuit board in accordance with claim 1, wherein the heat spreader is located under the electronic component and not electrically connected to the electronic component.

6. The flexible circuit board in accordance with claim 1, wherein the copper layer of the heat spreader has a thickness between 5 µm and 50 µm.

7. A heat spreader configured for dissipating heat from a flexible circuit board comprising a copper layer containing more than or equal to 50% copper grains by volume with (1,0,0) crystallographic orientation.

8. The heat spreader in accordance with claim 7, wherein the copper grains with the (1,0,0) crystallographic orientation in the copper layer has a grain size more than 5 µm.

9. The heat spreader in accordance with claim 8, wherein the copper layer has a thickness between 5 µm and 50 µm.

10. The heat spreader in accordance with claim 7, wherein the copper layer has a thickness between 5 µm and 50 µm.

* * * * *